United States Patent
Inoue

(10) Patent No.: US 10,425,731 B2
(45) Date of Patent: Sep. 24, 2019

(54) AUDIO PROCESSING APPARATUS, AUDIO PROCESSING METHOD, AND PROGRAM

(71) Applicant: CANON KABUSHIKI KAISHA, Tokyo (JP)

(72) Inventor: Tomohito Inoue, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 16/022,393

(22) Filed: Jun. 28, 2018

(65) Prior Publication Data
US 2019/0014411 A1 Jan. 10, 2019

(30) Foreign Application Priority Data

Jul. 4, 2017 (JP) .................. 2017-131073

(51) Int. Cl.
*H04R 3/04* (2006.01)
*H03G 5/16* (2006.01)
*H03G 5/18* (2006.01)
*H03G 5/22* (2006.01)

(52) U.S. Cl.
CPC .............. *H04R 3/04* (2013.01); *H03G 5/165* (2013.01); *H03G 5/18* (2013.01); *H03G 5/22* (2013.01); *H04R 2410/07* (2013.01)

(58) Field of Classification Search
CPC ...... H04R 3/04; H04R 2410/07; H03G 5/165; H03G 5/18; H03G 5/22
USPC ................................. 381/94.1–94.9
See application file for complete search history.

(56) References Cited

U.S. PATENT DOCUMENTS

| | | | |
|---|---|---|---|
| 2008/0212794 A1* | 9/2008 | Ikeda ................ | H04R 3/005 381/94.1 |
| 2014/0079245 A1* | 3/2014 | Maruko ............. | H04R 3/002 381/94.7 |

FOREIGN PATENT DOCUMENTS

JP 6-269084 A 9/1994

* cited by examiner

*Primary Examiner* — Davetta W Goins
*Assistant Examiner* — Daniel R Sellers
(74) *Attorney, Agent, or Firm* — Canon U.S.A.Inc., IP Division

(57) ABSTRACT

An audio processing apparatus includes an audio input unit configured to input a plurality of audio signals, a reduction unit configured to reduce the amount of wind noise in the plurality of input audio signals, and a controller configured to control the reduction amount of the wind noise by the reduction unit based on a difference between an in-phase component and an antiphase component of the plurality of audio signals and control the speed of change of the reduction amount of the wind noise by the reduction unit based on a magnitude of the in-phase component of the plurality of audio signals. The audio processing apparatus reduces the adverse effects of the wind noise reduction process on the audio quality of the audio signals.

11 Claims, 6 Drawing Sheets

FIG. 4

| STAGE | UPDATE INTERVAL (INCREASE) | UPDATE INTERVAL (REDUCTION) | UPDATE INTERVAL (REDUCTION, LARGE IN-PHASE COMPONENT) |
|---|---|---|---|
| 0 | | — | — |
| 1 | | 6 SEC | |
| 2 | | 6 SEC | |
| 3 | | 6 SEC | |
| 4 | | 6 SEC | |
| 5 | | 4 SEC | |
| 6 | | 4 SEC | |
| 7 | | 4 SEC | |
| 8 | | 4 SEC | |
| 9 | 1/60 SEC | 2 SEC | 25 MSEC (0.025 SEC) |
| 10 | | 2 SEC | |
| 11 | | 2 SEC | |
| 12 | | 2 SEC | |
| 13 | | 1 SEC | |
| 14 | | 1 SEC | |
| 15 | | 1 SEC | |
| 16 | | 1 SEC | |
| 17 | | 0.5 SEC | |
| 18 | | 0.5 SEC | |
| 19 | — | 0.5 SEC | |

WIND NOISE: SMALL ↔ LARGE

AUDIO PROCESSING APPARATUS, AUDIO PROCESSING METHOD, AND PROGRAM

BACKGROUND OF THE INVENTION

Field of the Invention

The present disclosure generally relates to audio processing and, more particularly, to an audio processing apparatus, an audio processing method, and a storage medium, which process an audio signal.

Description of the Related Art

As an apparatus which processes an audio signal, an imaging apparatus which records an audio signal in addition to an image signal has been used. Such an imaging apparatus which records an audio signal in addition to an image signal may have a function of reducing noise of wind in an audio signal to be recorded. The wind noise mainly has low frequency components, and therefore, a process of reducing wind noise is sometimes realized by using a high-pass filter which reduces low frequency components of an audio signal in many cases. When a process of the high-pass filter is constantly performed on audio signals, audio quality can be affected, and therefore, a cutoff frequency of the high-pass filter is often controlled in accordance with a detection level of the wind noise (refer to Japanese Patent Laid-Open No. 6-269084, for example).

In general, in the process of reducing wind noise, if wind noise is large, a cutoff frequency of a high-pass filter is set, and frequency components lower than the cutoff frequency of an audio signal are reduced. If the wind noise is reduced in the state in which the cutoff frequency of the high-pass filter is set high, the cutoff frequency of the high-pass filter is returned to a lower frequency. However, the cutoff frequency is slowly reduced within a long period of time so that audio quality can be maintained. Therefore, there can arise a situation in which an audio signal is constantly affected by the wind noise reduction process while the cutoff frequency of the high-pass filter is returned to a lower frequency.

SUMMARY OF THE INVENTION

According to an embodiment of the present disclosure, an audio processing apparatus includes an audio input unit configured to input a plurality of audio signals, a reduction unit configured to reduce an amount of wind noise in the plurality of input audio signals, and a controller configured to control the reduction amount of the wind noise by the reduction unit based on a difference between an in-phase component and an antiphase component of the plurality of audio signals and control a speed of change of the reduction amount of the wind noise by the reduction unit based on a magnitude of the in-phase component of the plurality of audio signals.

Further features of the present invention will become apparent from the following description of exemplary embodiments with reference to the attached drawings.

BRIEF DESCRIPTION OF THE DRAWINGS

FIG. 4 is a diagram illustrating the relationships between a magnitude of wind noise and stages of the cutoff frequency according to the embodiment.

DESCRIPTION OF THE EMBODIMENTS

Hereinafter, an embodiment of the present disclosure will be described with reference to the accompanying drawings.

Figure 1:
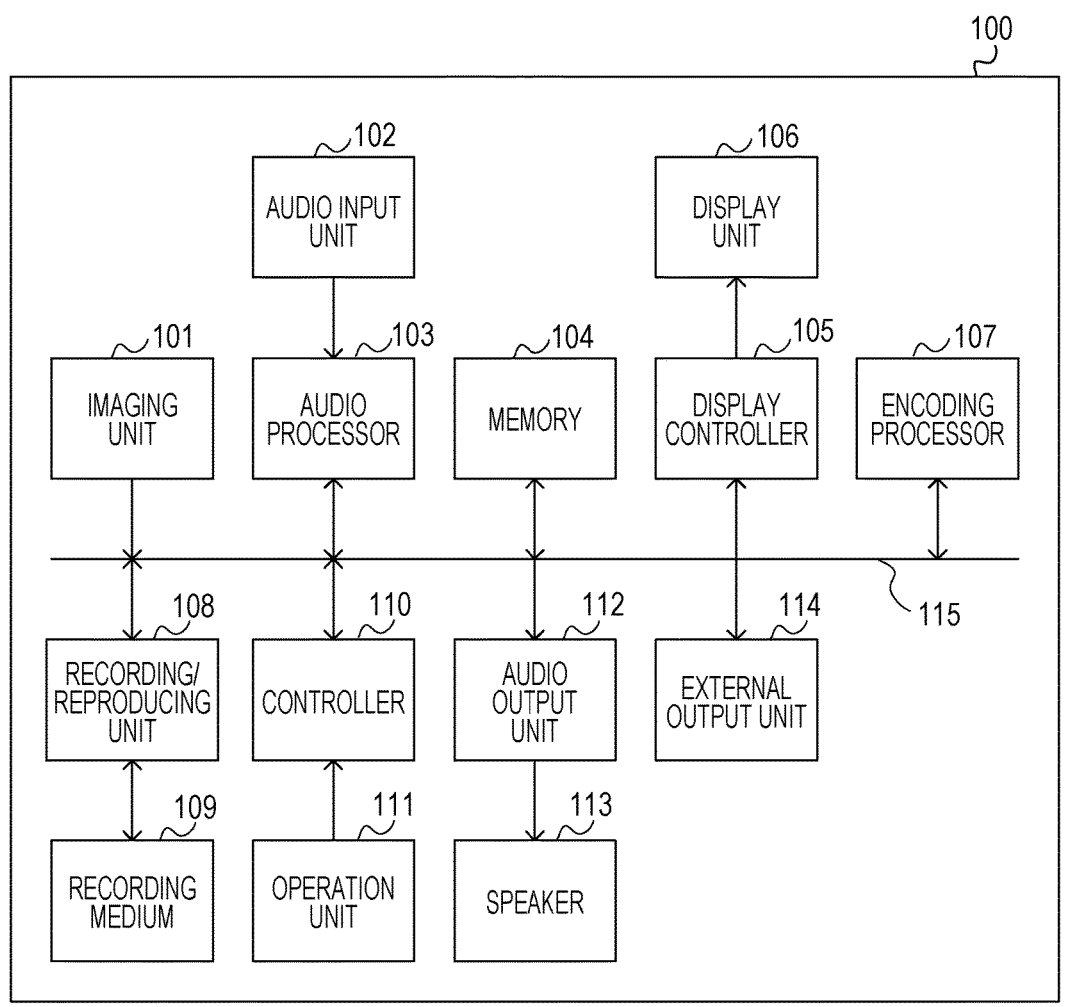
FIG. 1 is a diagram illustrating an example of a configuration of an imaging apparatus according to an embodiment.

FIG. 1 is a block diagram illustrating an example of a configuration of an imaging apparatus 100 according to an embodiment of the present disclosure. The imaging apparatus 100 of this embodiment is capable of processing and recording audio signals. The imaging apparatus 100 includes an imaging unit 101, an audio input unit 102, an audio processor 103, a memory 104, a display controller 105, a display unit 106, and an encoding processor 107. The imaging apparatus 100 further includes a recording/reproducing unit 108, a recording medium 109, a controller 110, an operation unit 111, an audio output unit 112, a speaker 113, and an external output unit 114.

The imaging unit 101 converts an optical image of an object obtained using an imaging lens by means of an imaging element and performs an analog/digital conversion process, an image control process, and the like so as to generate image data. The audio input unit 102 includes a plurality of internal microphones or a plurality of microphones connected thereto through audio terminals for collecting sound around the imaging apparatus 100 and performs an analog/digital conversion process, an audio process, and the like so as to generate audio data. The audio processor 103 performs an audio signal process on the audio data obtained by the audio input unit 102.

The memory 104 temporarily stores the image data obtained by the imaging unit 101 and the audio data processed by the audio processor 103. The display controller 105 displays a video image corresponding to the image data obtained by the imaging unit 101 and an operation screen, a menu screen, and the like of the imaging apparatus 100 in the display unit 106 or an external display apparatus through a video terminal, not illustrated. The encoding processor 107 reads the image data and the audio data which are temporarily stored in the memory 104 and performs a predetermined encoding process on the image data and the audio data so as to generate compressed image data, compressed audio data, and the like.

The recording/reproducing unit 108 records the compressed image data, the compressed audio data, and the like generated by the encoding processor 107 in the recording medium 109 and reads the compressed image data, the compressed audio data, various data, programs, and the like recorded in the recording medium 109. Here, the recording medium 109 at least records the compressed image data, the compressed audio data, and the like, and examples of the recording medium 109 include recording media employing arbitrary methods, such as a magnetic disk, an optical disc, and a semiconductor memory.

The controller 110 controls various functional units of the imaging apparatus 100 by transmitting control signals to the functional units of the imaging apparatus 100. The controller 110 includes a central processing unit (CPU) which executes various control processes and a memory. The operation unit 111 includes operation members, such as buttons and dials, and transmits an instruction signal to the controller 110 in accordance with a user operation.

The audio output unit 112 outputs the compressed audio data reproduced by the recording/reproducing unit 108 and the audio data output by the controller 110 to the speaker 113, the audio terminals, and the like. The external output unit 114 outputs the compressed video data, the compressed audio data, and the like reproduced by the recording/reproducing unit 108 to an external apparatus. A data bus 115 supplies various data including the audio data and the image data and various control signals to the functional units of the imaging apparatus 100.

Operation of the imaging apparatus 100 according to this embodiment will now be described.

When a user operates the operation unit 111 so as to issue an instruction for turning on the imaging apparatus 100, a power source supply unit, not illustrated, supplies a power source to the functional units of the imaging apparatus 100. When the power source is supplied to the imaging apparatus 100, the controller 110 determines a mode of a mode switch of the operation unit 111 from among a moving-image recording mode, a reproducing mode, and the like in accordance with an instruction signal issued by the operation unit 111.

In the moving-image recording mode, the imaging apparatus 100 may store the image data obtained by the imaging unit 101 and the audio data obtained by the audio input unit 102 as a single file. Furthermore, in the reproducing mode, the imaging apparatus 100 may reproduce the compressed image data recorded in the recording medium 109 using the recording/reproducing unit 108 so as to display the compressed image data in the display unit 106.

An operation in the moving-image recording mode will now be described. In the moving-image recording mode, the controller 110 transmits a control signal to the functional units included in the imaging apparatus 100 so that an imaging standby state is entered and the following operations are performed. The imaging unit 101 converts an optical image of an object obtained using the imaging lens into an image signal by means of the imaging element and performs an analog/digital conversion process, an image control process, and the like so as to generate image data. The image data obtained by the imaging unit 101 is transmitted to the display controller 105 which causes the display unit 106 to display a video image corresponding to the image data. The user prepares imaging while viewing the video image displayed as described above.

Furthermore, the audio input unit 102 converts analog audio signals obtained by the plurality of microphones into a plurality of digital audio signals. The audio processor 103 performs an arbitrary signal process on the digital audio signals obtained by the audio input unit 102 so as to generate multichannel audio data. The audio processor 103 outputs stereo audio data of two channels, for example, in this embodiment. The audio processor 103 transmits the obtained audio data to the audio output unit 112 which outputs the audio data as audio from the connected speaker 113 or earphones, not illustrated. The user may control a manual volume for determining a recoding volume while listening to the audio output as described above.

Subsequently, when the user operates a recording button or the like of the operation unit 111 so that a signal of an instruction for starting imaging is transmitted to the controller 110, the controller 110 transmits a control signal for starting imaging to the functional units included in the imaging apparatus 100 so that the following operations are performed. The imaging unit 101 converts an optical image of an object obtained using an imaging lens by means of an imaging element and performs an analog/digital conversion process, an image control process, and the like so as to generate image data. The image data obtains by the imaging unit 101 is transmitted to the display controller 105 which displays a video image corresponding to the image data. The image data obtained by the imaging unit 101 is transmitted to the memory 104 which stores the image data.

Furthermore, the audio input unit 102 converts analog audio signals obtained by the plurality of microphones into a plurality of digital audio signals. The audio processor 103 performs an arbitrary signal process on the digital audio signals obtained by the audio input unit 102 so as to generate multichannel audio data. The audio data obtained by the audio processor 103 is transmitted to the memory 104 which stores the audio data.

The encoding processor 107 reads the image data and the audio data which are temporarily stored in the memory 104 and performs a predetermined encoding process on the image data and the audio data so as to generate compressed image data, compressed audio data, and the like. Then the controller 110 forms a data stream by combining the compressed image data and the compressed audio data with each other and outputs the data stream to the recording/reproducing unit 108. The recording/reproducing unit 108 writes the data stream in the recording medium 109 as a single moving-image file under a file system control, such as Universal Disk Format (UDF) or File Allocation Tables (FAT). The operation described above is continued during the imaging (a period of time from when a control signal for start of the imaging is transmitted to when a control signal for termination of the imaging is transmitted).

Thereafter, when the user operates the recording button or the like of the operation unit 111 so that a signal of an instruction for terminating the imaging is transmitted to the controller 110, the controller 110 transmits a control signal for termination of the imaging to the functional units included in the imaging apparatus 100 so that the following operations are performed. The imaging unit 101 and the audio input unit 102 stops generation of image data and audio data. The encoding processor 107 reads the remaining image data and the remaining audio data which are stored in the memory 104 and performs a predetermined encoding process on the image data and the audio data so as to generate compressed image data, compressed audio data and the like. After the generation is completed, the encoding processor 107 stops the operation.

The controller 110 combines the remaining compressed image data and the remaining compressed audio data generated by the encoding processor 107 with each other so as to generate a data stream to be output to the recording/reproducing unit 108. The recording/reproducing unit 108 writes the data stream in the recording medium 109 as a single moving-image file under the file system management, such as UDF or FAT. When the supply of the data stream is stopped, the moving-image file is completed and the recording operation is stopped. When the recording operation is stopped, the controller 110 transmits a control signal to the functional units included in the imaging apparatus 100 so that the functional units are brought into an imaging standby state, and accordingly, the imaging apparatus 100 is returned to the imaging standby state.

Next, an operation in the reproducing mode will be described. In the reproducing mode, the controller 110 transmits a control signal to the functional units included in the imaging apparatus 100 so that a reproducing state is entered and the following operation is performed. The recording/reproducing unit 108 reads a moving-image file including the compressed image data and the compressed audio data recorded in the recording medium 109 in response to an operation performed by the user on the operation unit 111 or the like from the recording medium 109. Thereafter, the recording/reproducing unit 108 transmits the read compressed image data and the read compressed audio data to the encoding processor 107.

The encoding processor 107 decodes the compressed image data and the compressed audio data to be transmitted to the display controller 105 and the audio processor 103, respectively. The audio processor 103 performs an arbitrary signal process on a supplied digital audio signal so as to obtain audio data to be transmitted to the audio output unit 112. The display controller 105 displays a video image corresponding to the decoded image data in the display unit 106. Furthermore, the audio output unit 112 outputs audio corresponding to the decoded audio data from the speaker 113, an attached external speaker, or the like.

The imaging apparatus 100 according to this embodiment records and reproduces an image and audio as described above.

Figure 2:
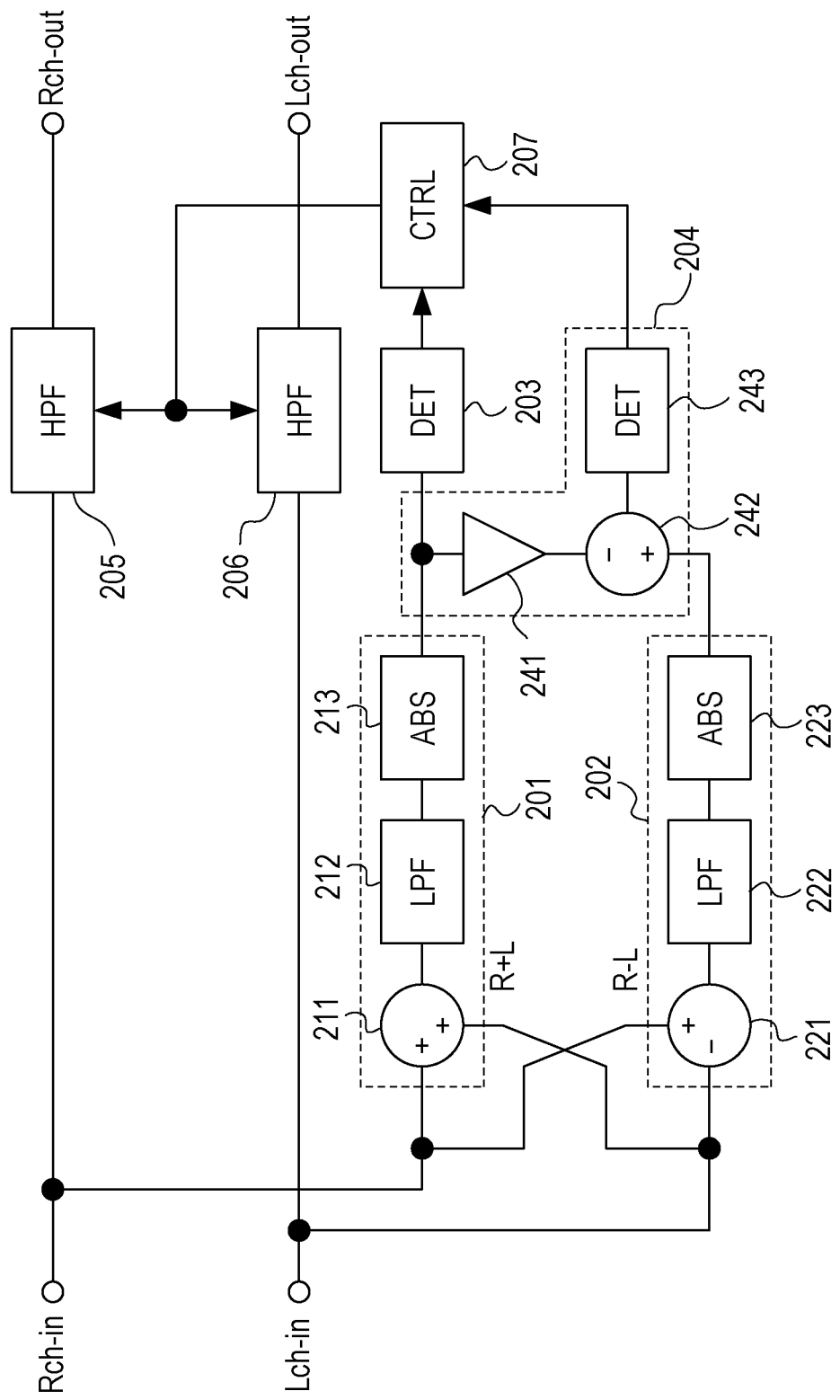
FIG. 2 is a diagram illustrating an example of a configuration of an audio processor according to the embodiment.

Next, an audio signal process performed by the audio processor 103 according to this embodiment will be described with reference to FIG. 2. FIG. 2 is a diagram illustrating an example of a configuration of the audio processor 103 according to this embodiment. The audio processor 103 of this embodiment includes an in-phase component generation unit 201, an antiphase component generation unit 202, an in-phase component detection unit 203, a wind noise detection unit 204, wind noise reduction units 205 and 206, and a controller 207.

The audio processor 103 receives two audio signals (audio data) including an audio signal Rch-in of a right channel (Rch) of stereo audio and an audio signal Lch-in of a left channel (Lch) which are obtained by different microphones as inputs. The audio processor 103 performs a process on the input audio signals (audio data) and outputs two audio signals (audio data) including an audio signal Rch-out of Rch and an audio signal Lch-out of Lch.

The in-phase component generation unit 201 generates an in-phase component (R+L) between the channels by adding the input two audio signals Rch-in and Lch-in to each other. The in-phase component generation unit 201 includes a calculation unit 211, a low-pass filter 212, and a conversion processor 213. The calculation unit 211 adds the two audio signals Rch-in and Lch-in to each other. The low-pass filter (LPF) 212 extracts a low frequency component from an output of the calculation unit 211. The conversion processor (ABS) 213 performs an absolute value conversion process on an output of the low-pass filter 212. Here, the low-pass filter 212 is provided to restrict a band so that wind noise is detected in an audio signal, and therefore, a cutoff frequency of the low-pass filter 212 is preferably set in a range from approximately 100 Hz to approximately 200 Hz, for example. The same is true to a low-pass filter 222 included in the antiphase component generation unit 202.

The antiphase component generation unit 202 subtracts one of the two input audio signals Rch-in and Lch-in from the other so as to generate an antiphase component between the channels. In this embodiment, the signal Lch-in is subtracted from the signal Rch-in so that an antiphase component (R−L) is generated. The antiphase component generation unit 202 includes a calculation unit 221, the low-pass filter 222, and a conversion processor 223. The calculation unit 221 subtracts the audio signal Lch-in of Lch from the audio signal Rch-in of Rch. The low-pass filter (LPF) 222 extracts a low frequency component in an output of the calculation unit 221. The conversion processor (ABS) 223 performs an absolute value conversion process on an output of the low-pass filter 222.

The in-phase component detection unit 203 detects an integral value of an in-phase component (R+L) generated by the in-phase component generation unit 201. The wind noise detection unit 204 detects an integral value of a difference between the in-phase component (R+L) generated by the in-phase component generation unit 201 and the antiphase component (R−L) generated by the antiphase component generation unit 202 as a magnitude of the wind noise included in the audio signal. The in-phase component detection unit 203 is an example of a first detection unit and the wind noise detection unit 204 is an example of a second detection unit.

The wind noise detection unit 204 includes an amplification unit 241, a calculation unit 242, and a detection unit 243. The amplification unit 241 applies a gain on the in-phase component (R+L) so as to control balance between the in-phase component (R+L) and the antiphase component (R−L). The calculation unit 242 subtracts the in-phase component (R+L) from the antiphase component (R−L) so as to detect a difference. In this embodiment, the calculation unit 242 subtracts the in-phase component (R+L) from the antiphase component (R−L). The detection unit 243 detects an integral value of the difference between the in-phase component (R+L) and the antiphase component (R−L) which is output from the calculation unit 242.

The wind noise reduction unit 205 performs a high-pass filter process on the input audio signal Rch-in so as to attenuate signal levels of frequencies lower than the cutoff frequency. In this way, the wind noise reduction unit 205 outputs an audio signal Rch-out obtained by reducing wind noise in the audio signal. The wind noise reduction unit 206 performs a high-pass filter process on the input audio signal Lch-in so as to attenuate signal levels of frequencies lower than the cutoff frequency. In this way, the wind noise reduction unit 206 outputs an audio signal Lch-out obtained by reducing wind noise of the audio signal. Each of the wind noise reduction units 205 and 206 are realized by a high-pass filter, for example.

The controller 207 controls the wind noise reduction process performed by the wind noise reduction units 205 and 206 based on results of the detections performed by the in-phase component detection unit 203 and the wind noise detection unit 204. The controller 207 controls the reduction amount of the wind noise by the wind noise reduction units 205 and 206, by setting, for example, the cutoff frequency in the high-pass filter process, based on the result of the detection performed by the wind noise detection unit 204, that is, based on the magnitude of the wind noise. Furthermore, the controller 207 controls the speed of change of the reduction amount of the wind noise performed by the wind noise reduction units 205 and 206 based on a result of the detection of the in-phase component detection unit 203, that is, the in-phase component (R+L). Specifically, the controller 207 controls a speed of lowering of the cutoff frequency performed by the wind noise reduction units 205 and 206 when a state in which the wind noise is large is changed to a state in which the wind noise is small.

Next, the wind noise reduction process performed by the audio processor 103 will be described. Note that it is assumed that the wind noise reduction units 205 and 206 are high-pass filters and control of the reduction amount of the wind noise is realized by controlling the cutoff frequency of the high-pass filters in a description below. In general imaging apparatuses, an Rch microphone used to obtain the audio signal Rch-in and an Lch microphone used to obtain the audio signal Lch-in are arranged in the vicinity of each other in terms of restriction by a size of a main body, for example.

Therefore, if a general audio signal which is not wind noise is input to Lch and Rch, a phase difference between the two audio signals Rch-in and Lch-in is small. Specifically, an antiphase component (R−L) between the channels is negligible, and therefore, the wind noise detection unit 204 does not detect wind noise. On the other hand, if sound of wind is input to Lch and Rch, correlation between the channels is low in terms of the sound of wind, and therefore, a phase difference between the two audio signals Rch-in and Lch-in is large. Specifically, an antiphase component (R−L) between the channels is detected, and therefore, the wind noise detection unit 204 detects wind noise.

Here, the amplification unit 241 included in the wind noise detection unit 204 applies a gain to the in-phase component (R+L) so as to achieve a balance between the in-phase component (R+L) and the antiphase component (R−L). The amplification unit 241 preferably applies, although depending on sensitivity of a microphone or a microphone chamber which accommodates the microphone relative to wind noise, a gain of approximately −6 dB, so that the wind noise detection unit 204 may detect the wind noise when sound of wind is input. Furthermore, the detection unit 243 included in the wind noise detection unit 204 integrates an output signal of the calculation unit 242. However, an integral time of the detection unit 243 is preferably approximately 500 ms, for example, so that misdetection caused by sound of a touch by the user on a portion in the vicinity of the microphone chamber is suppressed. Therefore, the detection unit 243 outputs a result of the integral of the output of the calculation unit 242 every 500 ms.

A result of the detection performed by the wind noise detection unit 204 is transmitted to the controller 207 every integral time of the detection unit 243, and the controller 207 sets a cutoff frequency of the wind noise reduction units 205 and 206 in accordance with the result of the detection performed by the wind noise detection unit 204. The controller 207 sets the cutoff frequency high when wind noise is large and sets the cutoff frequency low when the wind noise is small (when the wind noise is not detected). The cutoff frequency of the wind noise reduction units 205 and 206 is in a range from 50 Hz to 300 Hz in accordance with the detection result of the wind noise detection unit 204, for example, although depending on a configuration and an order of the high-pass filters. Audio corresponding to an audio signal is difficult to hear if wind with a speed of approximately 3 m/s blows although depending on configurations of the imaging apparatus and the microphone chambers, and therefore, a cutoff frequency of approximately 300 Hz is preferably set.

Specifically, the cutoff frequency of the wind noise reduction units 205 and 206 is set in 200 stages in the range from 50 Hz to 300 Hz in accordance with a magnitude of the wind noise in this embodiment. The controller 207 includes a table of the cutoff frequency of the wind noise reduction units 205 and 206 in accordance with a magnitude of the wind noise. The controller 207 sets (a stage of) a cutoff frequency corresponding to a magnitude of the wind noise detected by the detection unit 243 as a target frequency. In this case, the larger a magnitude of the wind noise is, the higher the cutoff frequency is.

FIG. 4 is a diagram illustrating the relationships between magnitudes of the wind noise detected by the detection unit 243 and the stages of the cutoff frequency of the wind noise reduction units 205 and 206. In FIG. 4, the smaller a stage 401 is, the smaller the cutoff frequency of the wind noise reduction units 205 and 206 is. A stage "0" is set when a magnitude of the wind noise is smallest (a lower limit value). A cutoff frequency corresponding to the stage "0" is 50 Hz. Furthermore, a stage "19" is set when a magnitude of the wind noise is largest (an upper limit value). A cutoff frequency corresponding to the stage "19" is 300 Hz. Similarly, stages corresponding to magnitudes of the wind noise are set in advance between the stages "0" to "19". The controller 207 stores the table illustrated in FIG. 4 therein.

Furthermore, columns 402 to 404 indicate change intervals for a change to a next stage from a certain stage of a cutoff frequency which is currently set (update intervals). For example, when the cutoff frequency is to be increased, the cutoff frequency of the wind noise reduction units 205 and 206 is changed by the controller 207 on a stage-by-stage basis every 1/60 seconds until a target stage is reached irrespective of a stage which is currently set as indicated by the update interval 402.

On the other hand, when the cutoff frequency is to be reduced, the cutoff frequency of the wind noise reduction units 205 and 206 is changed by the controller 207 on a stage-by-stage basis with a update interval corresponding to a stage which is currently set until a target stage is reached as indicated by the update interval 403.

For example, in a case where a magnitude of the wind noise is the upper limit value and a stage of the cutoff frequency is "19", if the lower limit value of the magnitude of the wind noise is detected, a target value of a stage of the cutoff frequency is "0". Therefore, the encoding processor 107 updates the cutoff frequency on a stage-by-stage basis with an interval of 0.5 seconds until the stage "16" is reached. Thereafter, the cutoff frequency is updated on a stage-by-stage basis with a time interval indicated by the update interval 403. The update of the cutoff frequency is performed on a stage-by-stage basis with an interval of 6 seconds until the stage is shifted from the stage "4" to the stage "0".

In this way, in the case where a state in which a magnitude of the wind noise is large is changed to a state in which a magnitude of the wind noise is small and the cutoff frequency of the wind noise reduction units 205 and 206 is reduced in accordance with the change, a change of audio quality becomes negligible when the change is performed over time (approximately several tens of seconds).

Furthermore, in this embodiment, if the in-phase component is large when the cutoff frequency is reduced, the cutoff frequency is updated on a stage-by-stage basis with a constant interval of 25 ms as denoted by the update interval 404 irrespective of a stage which is currently set. Specifically, the update interval for one stage is set such that a period of time in which a highest cutoff frequency is reduced to a lowest cutoff frequency is approximately 0.5 seconds. In this way, deterioration of audio quality is suppressed by changing the cutoff frequency on a stage-by-stage basis.

Figure 5:
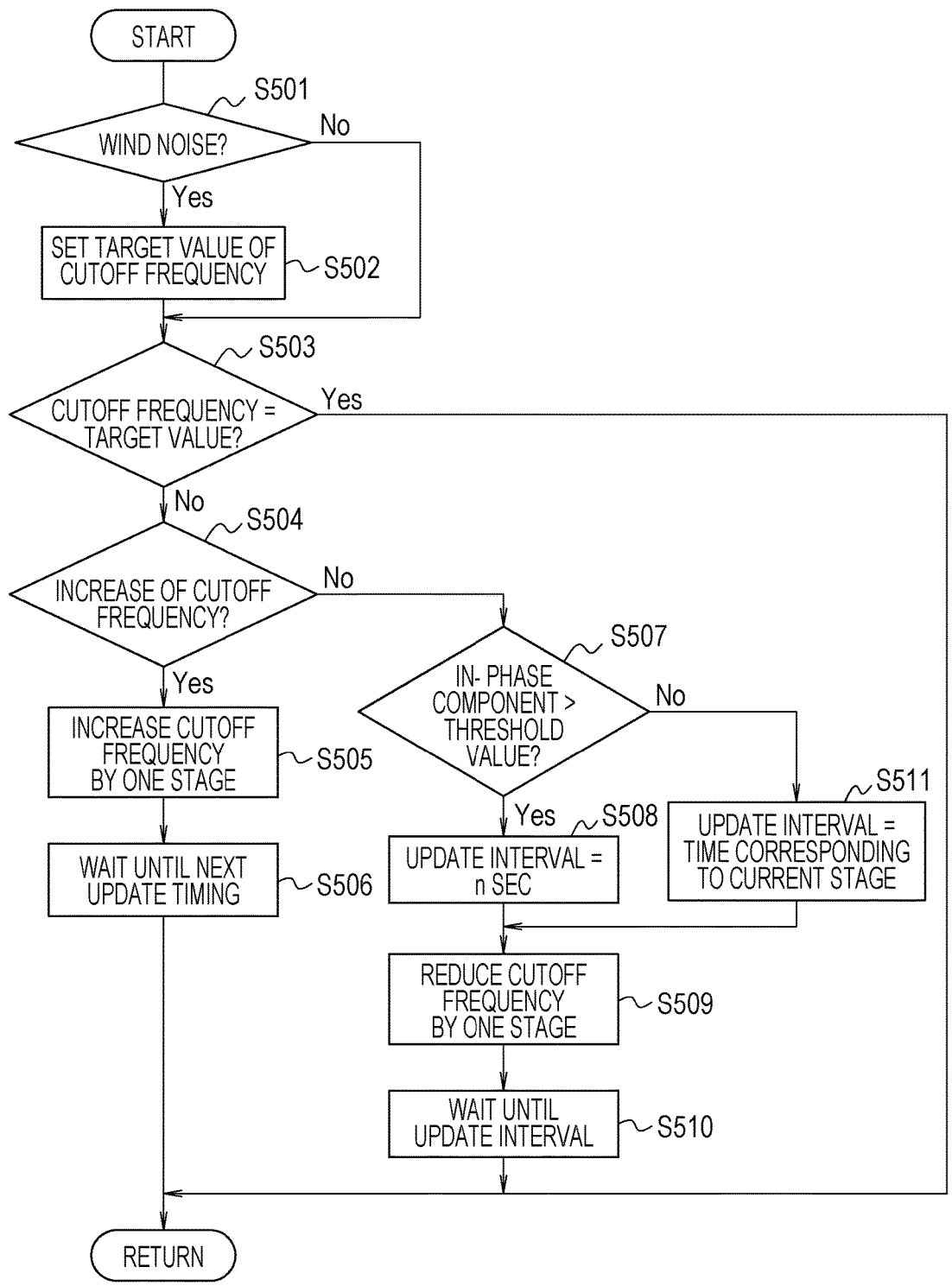
FIG. 5 is a flowchart of an example of a process of controlling the cutoff frequency according to the embodiment.

FIG. 5 is a flowchart of an example of a process of controlling the cutoff frequency of the wind noise reduction units 205 and 206. The process illustrated in FIG. 5 is executed while the controller 207 records a moving image. The controller 207 determines whether the wind noise detection unit 204 has newly detected wind noise (S501). As described above, the wind noise detection unit 204 integrates an output of the calculation unit 242 in a period of 500 ms and outputs a resultant value. Therefore, the wind noise detection unit 204 outputs the integral result to the controller 207 every 500 ms as a detection result of the wind noise.

If a result of the detection of the wind noise has been newly output, the controller 207 sets a target value (a target stage) of the cutoff frequency of the wind noise reduction units 205 and 206 corresponding to a magnitude of the detected wind noise based on the table illustrated in FIG. 4 (S502). Then the controller 207 determines whether a stage of the cutoff frequency which is currently set matches the target value (S503). When the determination is affirmative, the cutoff frequency stays in the current stage, that is, the cutoff frequency is not changed, and a timing when next wind noise is detected is waited.

On the other hand, when the determination is negative, the controller 207 determines whether the cutoff frequency is to be increased such that the target value becomes higher than the current cutoff frequency (S504). When the determination is affirmative, the controller 207 changes the cutoff frequency of the wind noise reduction units 205 and 206 to a cutoff frequency which is higher by one stage than the cutoff frequency which is currently set (S505). Then the controller 207 waits for a next update timing (S506). As illustrated in FIG. 4, when the cutoff frequency is to be increased, the controller 207 waits for 1/60 seconds.

When the determination is negative in stage S504, the controller 207 performs a process of lowering the cutoff frequency. However, a speed for lowering the cutoff frequency is changed depending on a magnitude of the in-phase component as described above. Therefore, the controller 207 determines whether the magnitude of the in-phase component is larger than a threshold value based on an output of the in-phase component detection unit 203 (S507).

When the determination is affirmative, an update interval of n seconds is set to change the cutoff frequency so that the cutoff frequency is quickly reduced to a target value (S508). For example, in the example of FIG. 4, the interval for a change to a next stage is set to 25 ms. When the determination is negative in stage S507, the controller 207 sets an update interval corresponding to a current stage (S511).

Then the controller 207 changes the cutoff frequency of the wind noise reduction units 205 and 206 to a cutoff frequency lower by one stage than the cutoff frequency which is currently set in accordance with the set update interval (S509) and waits until a next update timing (S510).

Figure 3A:
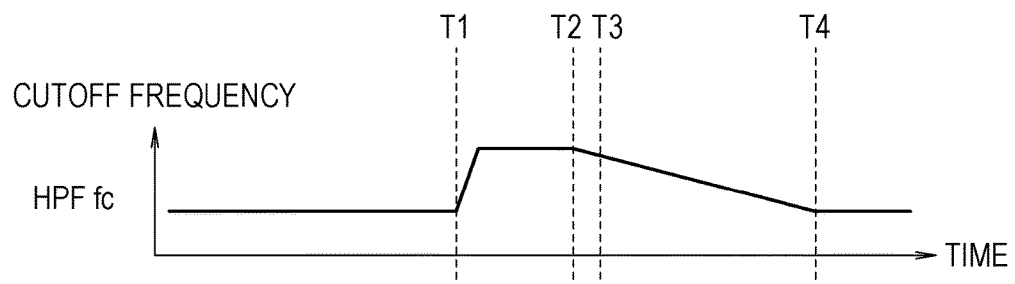
FIG. 3A is a timing chart of a first example of control timings of a cutoff frequency according to the embodiment.
Figure 3B:
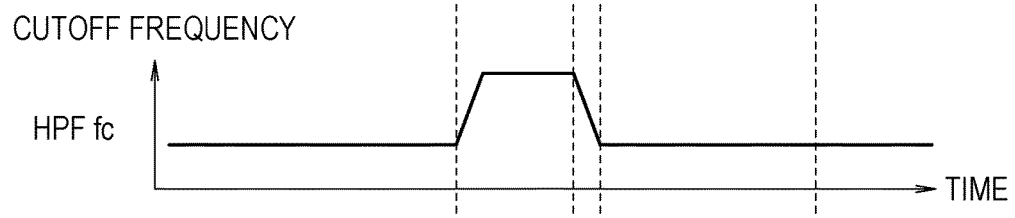
FIG. 3B is a timing chart of a second example of control timings of a cutoff frequency according to the embodiment.

FIGS. 3A and 3B are timing charts illustrating a timing when the wind noise is detected and a timing when the cutoff frequency of the wind noise reduction units 205 and 206 is controlled. In both FIGS. 3A and 3B, a magnitude of the wind noise is the lower limit value until a time point T1, and the cutoff frequency of the wind noise reduction units 205 and 206 corresponds to the stage "0". In a time point T2, when the wind noise of the upper limit value is detected, the cutoff frequency of the wind noise reduction units 205 and 206 is set high so as to correspond to the stage "19". Thereafter, a magnitude of the wind noise reaches the lower limit value again in a time point T3. Here, in this embodiment, a period of time in which the cutoff frequency of the wind noise reduction units 205 and 206 is reduced to the stage "0" which is the target value is set in accordance with a detection result of the in-phase component detection unit 203.

The in-phase component detection unit 203 sets an integral time substantially equal to that of the wind noise detection unit 204, integrates low frequency components of the in-phase component (R+L), and transmits a detection result to the controller 207. When the detection result of the in-phase component detection unit 203 is not larger than the threshold value, it is highly likely that input audio is not normal audio but background noise or environmental sound. Therefore, as illustrated in FIG. 3A, the controller 207 sets the update interval for a change to a next stage in accordance with the update interval 403 illustrated in FIG. 4, for example, and sets a long period of time for lowering the cutoff frequency of the wind noise reduction units 205 and 206 to the target value. By this, the cutoff frequency of the wind noise reduction units 205 and 206 may be slowly reduced over time so that a change of audio quality due to background noise, environmental sound, or the like becomes negligible. In FIG. 3A, an example of lowering of the cutoff frequency in a first period of time from the time point T2 to a time point T4 is illustrated.

In this case, as the period of time in which the cutoff frequency is reduced, a period of time in which the highest cutoff frequency is reduced to the lowest frequency is preferably set to approximately 60 seconds so that a feeling of strangeness of audio quality of audio signals is avoided. The background noise and the environmental sound correspond to a sound source in which a change of audio quality caused by a change of a cutoff frequency of a high-pass filter is easily recognized, and therefore, a feeling of strangeness may be reduced when the audio quality is changed over approximately 60 seconds.

When the detection result of the in-phase component detection unit 203 is larger than the threshold value, it is highly likely that lower frequencies of input audio are normal signals. Therefore, as illustrated in FIG. 3B, the controller 207 sets the update interval for a change to a next stage of 25 ms in accordance with the update interval 404 illustrated in FIG. 4, for example, and sets a short period of time for lowering the cutoff frequency of the wind noise reduction units 205 and 206 to the target value. By this, the cutoff frequency of the wind noise reduction units 205 and 206 may be quickly reduced to the target value within a short period of time so that the state in which the lower frequency components in the input audio are reduced is not continued for a long period of time, and accordingly, adverse effects of the wind noise reduction process to the audio quality may be reduced. In FIG. 3B, an example of lowering of the cutoff frequency in a second period of time from the time point T2 to the time point T3 which is shorter than the first period of time is illustrated.

In this case, as the period of time in which the cutoff frequency is reduced, a period of time in which the highest cutoff frequency is reduced to the lowest frequency is preferably set to approximately 0.5 seconds so that the period of time in which the low frequency components are reduced by the high-pass filters is suppressed to be minimum. When a normal audio signal is input, reduction of low frequency components by the high-pass filters is larger problem than reduction of a change of audio quality caused by a change of the cutoff frequency of the high-pass filters. Therefore, by lowering the cutoff frequency within a short period of time of approximately 0.5 seconds, a period of time in which the low frequency components in the input audio signal are reduced may be reduced and audio signals having low frequency components which are not cut may be recorded for a longer period of time.

According to this embodiment, the controller 207 controls a level of reduction of the wind noise performed by the wind noise reduction units 205 and 206 in accordance with a magnitude of the wind noise detected by the wind noise detection unit 204. When the level of reduction of the wind noise performed by the wind noise reduction units 205 and 206 is to be reduced, the controller 207 controls the speed of change of the reduction amount of the wind noise based on a result of a detection performed by the in-phase component detection unit 203. The controller 207 slowly decreases the amount of reduction of the wind noise over time so as to suppress a change of audio quality when the result of the detection performed by the in-phase component detection unit 203 is less than or equal to the threshold value. Furthermore, when the detection result of the in-phase component detection unit 203 is greater than the threshold value, the controller 207 quickly decreases the amount of reduction of the wind noise within a short period of time since it is highly likely that input audio is normal audio. By this, the adverse effects of the wind noise reduction process to audio quality of the audio signal may be reduced.

Figure 6:
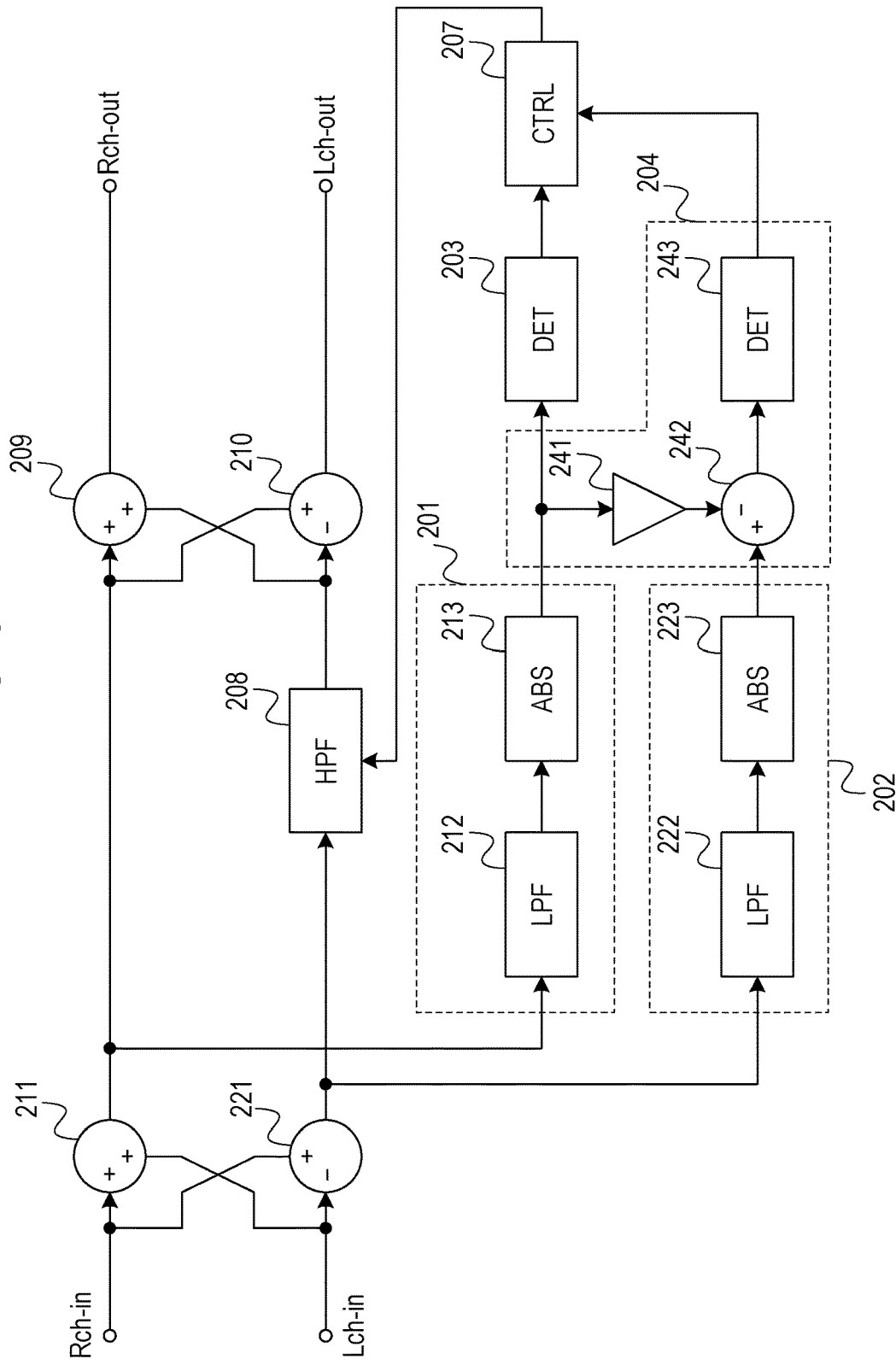
FIG. 6 is a diagram illustrating another example of the configuration of the audio processor according to the embodiment.

Note that, although the wind noise is reduced by individually performing the high-pass filter process on input audio signals of Rch and Lch as illustrated in FIG. 2 in this embodiment, the audio processor 103 configured as illustrated in FIG. 6 may be employed, for example.

FIG. 6 is a diagram illustrating another example of the configuration of the audio processor 103. Components the same as those of FIG. 2 are denoted by reference numerals the same as those of FIG. 2. In the audio processor 103 of FIG. 6, the calculation unit 211 obtains a signal of an in-phase component (R+L) and the calculation unit 221 obtains a signal of an antiphase component (R−L). Then a wind noise reduction unit (a high-pass filter, for example) 208 performs a high-pass filter process on the signal of the antiphase component (R−L) so as to reduce wind noise. As described above, when audio having the low correlation between Rch and Lch, such as the wind noise, is included, the signal of the antiphase component (R−L) is increased. Therefore, the wind noise reduction unit 208 attenuates low frequency components of the signal of the antiphase component (R−L) so that the wind noise is reduced.

Furthermore, the controller 207 performs the process illustrated in FIG. 5 so that a cutoff frequency of the wind noise reduction unit 208 is set based on a magnitude of the wind noise detected by the wind noise detection unit 204. Furthermore, the controller 207 controls a speed of the reduction of the cutoff frequency based on an output of the in-phase component detection unit 203.

A calculation unit 209 reduces a magnitude of a signal obtained by adding a signal of an in-phase component (R+L) supplied from the calculation unit 211 and a signal of an antiphase component (R−L) supplied from the wind noise reduction unit 208 to each other to be half and outputs the signal as an audio signal Rch-out of Rch. Furthermore, a calculation unit 210 reduces a magnitude of a signal obtained by subtracting a signal of an antiphase component (R−L) supplied from the wind noise reduction unit 208 from a signal of an in-phase component (R+L) supplied from the calculation unit 211 to be half and outputs the signal as an audio signal Lch-out of Lch.

Other Embodiments

The present disclosure may be realized by a process of supplying a program which realizes at least one of the functions of the foregoing embodiment to a system or an apparatus through a network or a storage medium and reading and executing the program using at least one processor included in the system or the apparatus. Furthermore, the present disclosure may be realized by a circuit which realizes at least one function (application specific integrated circuits (ASIC), for example).

Note that the embodiment described above is merely an embodied example of the present disclosure, and the technical scope of the present disclosure is not limited to the embodiment. Specifically, the present disclosure may be embodied in various forms without departing from the technical concept or main features.

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-131073 filed Jul. 4, 2017, which is hereby incorporated by reference herein in its entirety.

What is claimed is:

1. An audio processing apparatus comprising:
an audio input unit configured to input a plurality of audio signals;
a reduction unit configured to reduce an amount of wind noise in the plurality of input audio signals; and
a controller configured to control the reduction amount of the wind noise by the reduction unit based on a difference between an in-phase component and an antiphase component of the plurality of audio signals and control a speed of change of the reduction amount of the wind noise by the reduction unit based on a magnitude of the in-phase component of the plurality of audio signals;
wherein, when the reduction unit decreases the reduction amount of the wind noise, the controller decreases the reduction amount of the wind noise in a first period of time in a case where the in-phase component of the plurality of audio signals is not larger than a threshold value, and decreases the reduction amount of the wind noise in a second period of time which is shorter than the first period of time.

2. The audio processing apparatus according to claim 1, further comprising:
a first detection unit configured to detect a magnitude of an in-phase component of the plurality of audio signals; and
a second detection unit configured to detect a difference between the in-phase component and an antiphase component of the plurality of audio signals,
wherein the controller controls the reduction unit in accordance with results of detections performed by the first and second detection units.

3. The audio processing apparatus according to claim 2, wherein the first detection unit detects a magnitude of a low frequency component of the in-phase component of the plurality of audio signals.

4. The audio processing apparatus according to claim 1, wherein the reduction unit is a high-pass filter, and
the controller controls a cutoff frequency of the high-pass filter based on a difference between the in-phase component and an antiphase component of the plurality of audio signals.

5. The audio processing apparatus according to claim 4, wherein the controller sets the cutoff frequency of the high-pass filter higher as the difference between the in-phase component and the antiphase component of the plurality of audio signals is increased.

6. An audio processing apparatus comprising:
an audio input unit configured to input a plurality of audio signals;
a reduction unit configured to reduce an amount of wind noise in the plurality of input audio signals; and
a controller configured to control the reduction amount of the wind noise by the reduction unit based on a difference between an in-phase component and an antiphase component of the plurality of audio signals and control a speed of change of the reduction amount of the wind noise by the reduction unit based on a magnitude of the in-phase component of the plurality of audio signals,
wherein a plurality of stages of reduction amounts of the wind noise are set in the reduction unit in accordance with a difference between an in-phase component and an antiphase component of the plurality of audio signals, and
when the reduction unit decreases the reduction amount of the wind noise, the controller changes the reduction amount of the wind noise to a target stage on a stage-by-stage basis with a first change interval corresponding to a set stage when the in-phase component of the plurality of audio signals is not larger than a threshold value, and changes the reduction amount of the wind noise to a target stage on a stage-by-stage basis with a second change interval which is shorter than the first change interval irrespective of a set stage when the in-phase component of the plurality of audio signals is larger than the threshold value.

7. An audio processing apparatus comprising:
an input unit configured to input audio signals of right and left channels;
a reduction unit configured to reduce wind noise of the audio signal by performing a high-pass filter process on the audio signal input by the input unit; and
a controller configured to set a cutoff frequency of the high-pass filter of the reduction unit based on a difference between a signal obtained by adding the audio signal of the right channel and the audio signal of the left channel which are input by the input unit and a signal obtained by subtracting one of the audio signals of the right and left channels from the other of the audio signals and controls a speed of reduction of the cutoff frequency of the high-pass filter of the reduction unit based on a magnitude of the added signal,
wherein the controller sets the cutoff frequency higher as the signal obtained by the subtraction becomes larger than the signal obtained by the addition, determines a period of time in which the cutoff frequency of the high-pass filter is reduced from a first cutoff frequency to a second cutoff frequency as a first period of time when the signal obtained by the addition is larger than a threshold value, and determines a period of time in which the cutoff frequency of the high-pass filter is reduced from the first cutoff frequency to the second cutoff frequency as a second period of time which is longer than the first period of time when the signal obtained by the addition is not larger than the threshold value.

8. The audio processing apparatus according to claim 7, wherein the reduction unit individually performs the high-pass filter process on the audio signal of the right channel and the audio signal of the left channel.

9. The audio processing apparatus according to claim 7, wherein the reduction unit performs the high-pass filter process on the signal obtained by the subtraction, adds the signals which have been subjected to the high-pass filter process to the signal obtained by the addition so as to output one of the audio signals of the channels, and subtracts the signals which have been subjected to the high-pass filter process from the signal obtained by the addition so as to output the other of the audio signals of the channels in which wind noise is reduced.

10. An audio processing method comprising:
inputting a plurality of audio signals;
reducing wind noise of the plurality of input audio signals; and
controlling a reduction amount of the wind noise in the reducing based on a difference between an in-phase component and an antiphase component of the plurality of audio signals and controlling a speed of a change of the reduction amount of the wind noise in the reducing based on a magnitude of the in-phase component of the plurality of audio signals,
wherein, when the reducing decreases the reduction amount of the wind noise, the controller decreases the reduction amount of the wind noise in a first period of time in a case where the in-phase component of the plurality of audio signals is not larger than a threshold value, and decreases the reduction amount of the wind noise in a second period of time which is shorter than the first period of time.

11. A non-transitory computer-readable storage medium that stores computer executable instructions for causing a computer to implement a method, the method comprising:
inputting a plurality of audio signals;
reducing wind noise of the plurality of input audio signals; and
controlling a reduction amount of the wind noise in the reducing based on a difference between an in-phase component and an antiphase component of the plurality of audio signals and controlling a speed of a change of the reduction amount of the wind noise in the reducing based on a magnitude of the in-phase component of the plurality of audio signals, wherein, when the reducing decreases the reduction amount of the wind noise, the controller decreases the reduction amount of the wind noise in a first period of time in a case where the in-phase component of the plurality of audio signals is not larger than a threshold value, and decreases the reduction amount of the wind noise in a second period of time which is shorter than the first period of time.

\* \* \* \* \*